United States Patent
Hsieh et al.

(10) Patent No.: US 9,305,653 B1
(45) Date of Patent: Apr. 5, 2016

(54) MEMORY ARRAY AND OPERATING METHOD OF SAME

(71) Applicant: MACRONIX INTERNATIONAL CO., LTD., Hsinchu (TW)

(72) Inventors: Chih-Chang Hsieh, Hsinchu (TW); Kuo-Pin Chang, Miaoli County (TW); Hang-Ting Lue, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 14/561,630

(22) Filed: Dec. 5, 2014

(51) Int. Cl.
*G11C 16/04* (2006.01)
*G11C 16/14* (2006.01)
*G11C 11/56* (2006.01)
*G11C 16/26* (2006.01)
*G11C 16/24* (2006.01)
*G11C 16/34* (2006.01)

(52) U.S. Cl.
CPC .......... *G11C 16/14* (2013.01); *G11C 11/5628* (2013.01); *G11C 16/0408* (2013.01); *G11C 16/0483* (2013.01); *G11C 16/24* (2013.01); *G11C 16/26* (2013.01); *G11C 16/3431* (2013.01); *G11C 16/3459* (2013.01)

(58) Field of Classification Search
CPC .............................. G11C 16/10; G11C 16/3431
USPC ........................................ 365/185.28, 185.02
See application file for complete search history.

(56) References Cited

U.S. PATENT DOCUMENTS

| | | | | |
|---|---|---|---|---|
| 7,869,280 B2* | 1/2011 | Kosaki | ............... | G11C 11/5628 365/185.02 |
| 8,199,579 B2* | 6/2012 | Shiino | ............... | G11C 11/5635 365/185.03 |
| 2010/0271883 A1* | 10/2010 | Kim | .................. | G11C 16/14 365/185.22 |
| 2011/0188313 A1* | 8/2011 | Higashitani | ........ | G11C 11/5628 365/185.17 |
| 2012/0275230 A1* | 11/2012 | Han | ................ | G11C 8/08 365/185.18 |
| 2012/0307567 A1* | 12/2012 | Kim | .................. | G11C 16/0483 365/185.25 |
| 2014/0169093 A1* | 6/2014 | Parat | ................. | G11C 16/16 365/185.11 |
| 2014/0247663 A1* | 9/2014 | Yuan | ................. | G11C 16/10 365/185.17 |
| 2015/0228352 A1* | 8/2015 | Choi | ................. | G11C 16/28 365/185.2 |
| 2015/0294724 A1* | 10/2015 | Nam | ................. | G11C 16/0483 365/185.11 |

* cited by examiner

*Primary Examiner* — Son Mai
(74) *Attorney, Agent, or Firm* — Finnegan, Henderson, Farabow, Garrett & Dunner LLP

(57) ABSTRACT

A method of operating a memory array is disclosed. The memory array includes a plurality of memory cells arranged in rows and columns, wherein a plurality of parallel memory strings correspond to respective ones of the columns, and a plurality of word lines are arranged orthogonal to the plurality of memory strings, each word line being connected to gate electrodes of a corresponding one of the rows of memory cells. The method includes performing a program operation that programs all of the memory cells on edge word lines located at opposite edges of the memory array, and that programs selected memory cells between the edge word lines in the memory array according to input data to be stored in the memory array. Each programmed memory cell has a threshold voltage at a program verify (PV) level.

16 Claims, 9 Drawing Sheets

|     | WL0 | WL1 | WL2 | WL3 | ... | WL30 | WL31 | ... | WL60 | WL61 | WL62 | WL63 |
| --- | --- | --- | --- | --- | --- | --- | --- | --- | --- | --- | --- | --- |
| 210 | PV' | EV | PV | EV | ... | PV | EV | ... | PV | EV | PV | PV' |
| 211 | PV' | PV | EV | PV | ... | EV | PV | ... | EV | PV | EV | PV' |
| 212 | PV' | EV | PV | EV | ... | PV | EV | ... | PV | EV | PV | PV' |
| 213 | PV' | PV | EV | PV | ... | EV | PV | ... | EV | PV | EV | PV' |

FIG. 4

| | 210 | 211 | 212 | 213 |
|---|---|---|---|---|
| WL0 | EV | EV | EV | EV |
| WL1 | EV | PV | EV | PV |
| WL2 | PV | EV | PV | EV |
| WL3 | EV | PV | EV | PV |
| ... | | | | |
| WL30 | PV | EV | PV | |
| WL31 | EV | PV | EV | |
| ... | | | | |
| WL60 | PV | PV | PV | EV |
| WL61 | EV | EV | EV | PV |
| WL62 | PV | EV | PV | EV |
| WL63 | EV | EV | EV | EV |

FIG. 8

MEMORY ARRAY AND OPERATING METHOD OF SAME

BACKGROUND

1. Field of the Invention

The present disclosure relates to a memory array and operation method of the same and, more particularly, to an operating method of a memory array that can suppress a read disturbance.

2. Background of the Invention

A non-volatile memory device is a semiconductor device capable of continuously storing data even when the supply of electricity is removed. A NAND flash memory device is a type of non-volatile memory device that has been developed. The NAND flash memory device includes a memory array having a plurality of memory cells arranged in parallel strings. A read disturbance problem may occur in the strings due to a biasing scheme applied during a read operation.

SUMMARY

According to an embodiment of the disclosure, a method of operating a memory array is provided. The memory array includes a plurality of memory cells arranged in rows and columns, wherein a plurality of parallel memory strings correspond to respective ones of the columns, and a plurality of word lines are arranged orthogonal to the plurality of memory strings, each word line being connected to gate electrodes of a corresponding one of the rows of memory cells. The method includes performing a program operation that programs all of the memory cells on edge word lines located at opposite edges of the memory array, and that programs selected memory cells between the edge word lines in the memory array according to input data to be stored in the memory array. Each programmed memory cell has a threshold voltage at a program verify (PV) level.

According to another embodiment of the disclosure, an integrated circuit includes a memory array and a control circuit. The memory array includes memory cells arranged in rows and columns, wherein a plurality of parallel memory strings correspond to respective ones of the columns, and a plurality of word lines are arranged orthogonal to the plurality of memory strings, each word line being connected to gate electrodes of a corresponding one of the rows of memory cells. The control circuit is configured to perform a program operation on the memory array to program all of the memory cells on edge word lines located at opposite edges of the memory array, and program selected memory cells between the edge word lines in the memory array according to input data to be stored in the memory array. Each programmed memory cell has a threshold voltage at a program verify (PV) level.

According to still another embodiment of the disclosure, a control circuit for operating a memory array is provided. The memory array includes a plurality of memory cells. The control circuit includes circuitry configured to perform a program operation on the memory array to program all of the memory cells on edge word lines located at opposite edges of the memory array, and program selected memory cells between the edge word lines in the memory array according to input data to be stored in the memory array. Each programmed memory cell has a threshold voltage at a program verify (PV) level.

BRIEF DESCRIPTION OF THE DRAWINGS

FIG. 4 schematically illustrates a programming pattern used for programming memory cells in a memory array, according to an illustrated embodiment.

FIG. 8 schematically illustrates a programming pattern used for programming memory cells in a memory array, as a comparative example.

DETAILED DESCRIPTION

Reference will now be made in detail to the present embodiments, examples of which are illustrated in the accompanying drawings. Wherever possible, the same reference numbers will be used throughout the drawings to refer to the same or like parts.

Figure 1:
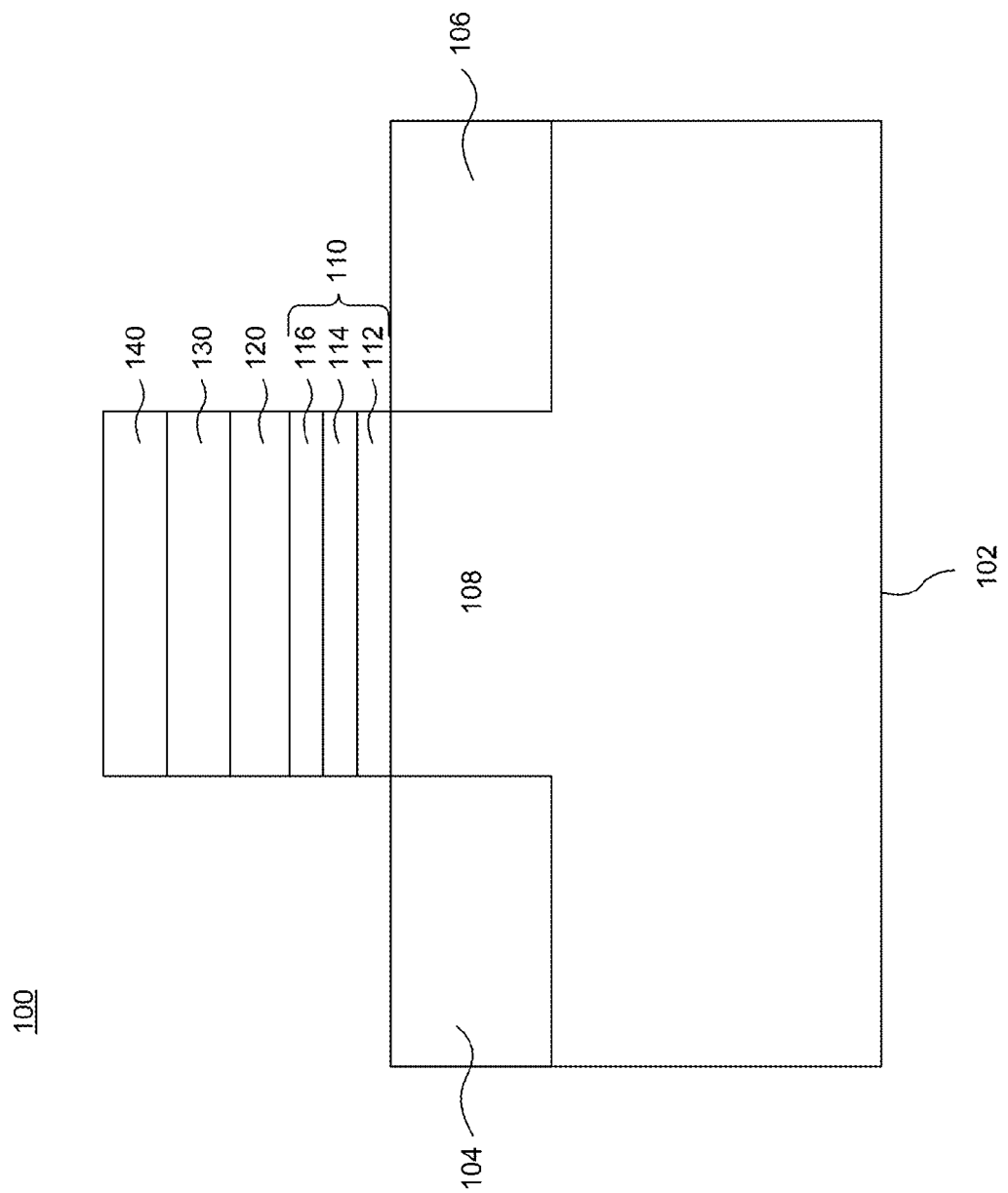
FIG. 1 schematically illustrates a cross-sectional view of a memory cell, according to an illustrated embodiment.

FIG. 1 is a cross-sectional view of a memory cell 100, according to an illustrated embodiment. Memory cell 100 includes a substrate 102, a first doped region 104 and a second doped region 106 disposed in substrate 102, a channel region 108 disposed between first doped region 104 and second doped region 106, a tunnel dielectric structure 110 disposed above channel region 108, a charge storage layer 120 disposed above tunnel dielectric structure 110, an insulating layer 130 disposed above charge storage layer 120, and a gate electrode 140 disposed above insulating layer 130. Substrate 102 can be implemented as a P-well formed in a silicon wafer, and first and second doped regions 104 and 106 can be N-type. Alternatively, substrate 102 can be implemented as an N-well, and first and second doped regions 104 and 106 can be P-type. Tunnel dielectric structure 110 can be formed to have any structure known in the art for a tunnel dielectric structure. In the illustrated embodiment, tunnel dielectric structure 110 is a tri-layer thin ONO structure including a lower oxide layer 112 (O), a nitride layer 114 (N) disposed on lower oxide layer 112, and an upper oxide layer 116 (O) disposed on nitride layer 114. Each one of lower oxide layer 112, nitride layer 114, and upper oxide layer 116 has a thickness of about 15 Å to 40 Å. Charge storage layer 120 is formed of silicon oxide or silicon nitride, or other charge storage materials, such as $Al_2O_3$, HfOx, $ZrO_X$. Charge storage layer 120 has a thickness of about 30 Å to 120 Å.

In order to program memory cell 100, first and second doped regions 104 and 106, and substrate 102 are grounded, and a programming voltage of, for example, about 18V is applied to gate electrode 140. As a result, electrons are injected from channel region 108 into charge storage layer 120, raising a threshold voltage $V_T$ of memory cell 100 to a program verify (PV) level. In order to erase data from memory cell 100, gate electrode 140 is grounded, first and second doped regions 104 and 106 are grounded or float, and an erasing voltage of, for example, about 18V is applied to substrate 102. As a result, electrons are removed from charge storage layer 120, lowering threshold voltage $V_T$ of memory cell 100 to an erase verify (EV) level which is lower than the PV level.

Memory cell 100 can be a single level cell (SLC) or a multi-level cell (MLC). $V_T$ of a SLC can be set to one EV level, or one PV level. $V_T$ of a MLC can be set to one EV level, or one of multiple PV levels.

Figure 2:
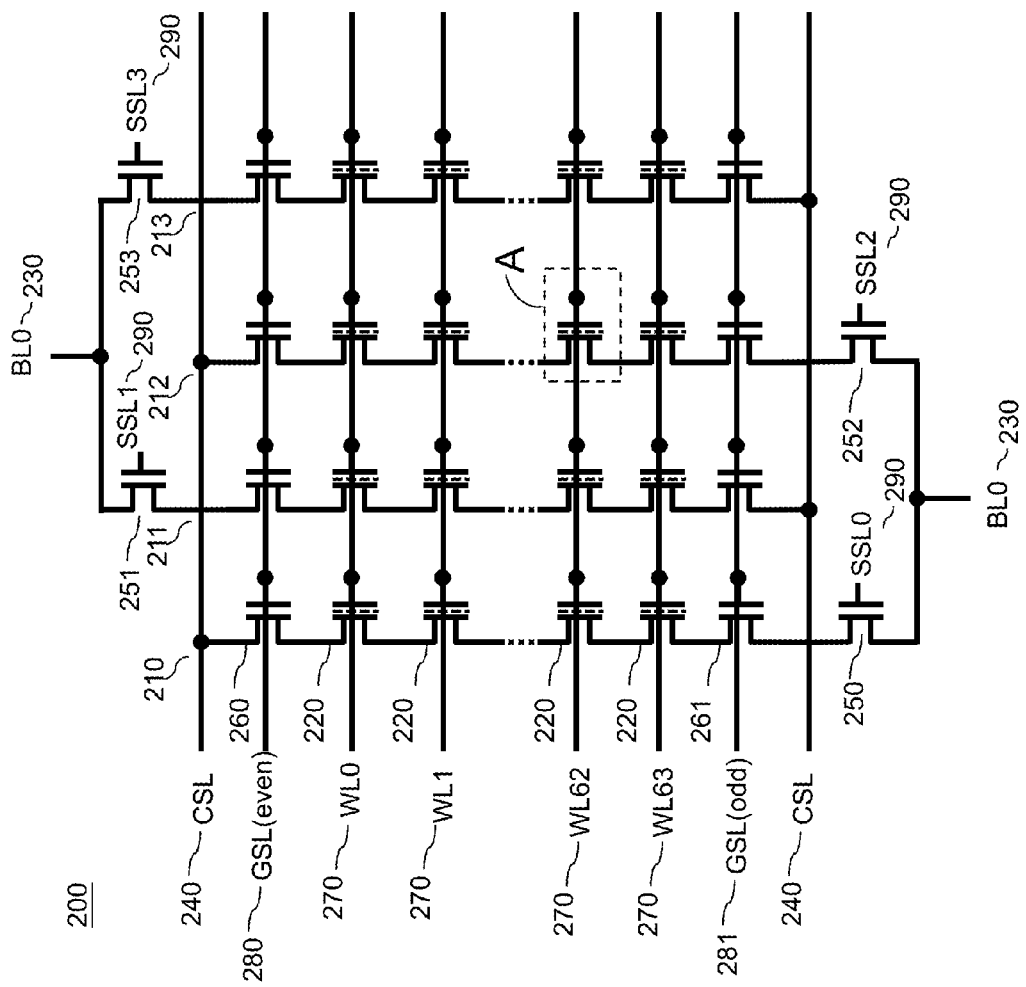
FIG. 2 schematically illustrates an equivalent circuit of a memory array, according to an illustrated embodiment.

FIG. 2 schematically illustrates an equivalent circuit of a three-dimensional vertical gate (3DVG) memory array 200 (hereinafter referred to as "memory array 200"), according to an illustrated embodiment. Memory array 200 has a NAND structure, including a plurality of memory strings 210-213. Each one of memory strings 210-213 includes a plurality of, for example, sixty-four (64), memory cells 220 connected in series and corresponds to a column of memory array 200.

Memory strings 210-213 constitute a block array. Each memory string 210-213 corresponds to a channel bit line (BL). The channel BLs of the block array are grouped together and connected to a global bit line (GBL), which is indicated as BL0 230 in FIG. 2. Although not illustrated in FIG. 2, memory array 200 may include global bit lines other than BL0 230 connected to memory strings other than memory strings 210-213. Each memory string 210-213 is connected between BL0 230 and one of common source lines (CSL) 240. Adjacent memory strings 210-213 alternate between a bit line end-to-source line end orientation and a source line end-to-bit line end orientation. For example, memory strings 210 and 212 have the source line end-to-bit line end orientation, while memory strings 211 and 213 have the bit line end-to-source line end orientation. That is, for each one of memory strings 210 and 212, CSL 240 is connected to an upper end of the memory string, and BL0 230 is connected to a lower end of the memory string, as viewed in FIG. 2; and for each one of memory strings 211 and 213, BL0 230 is connected to an upper end of the memory string, and CSL 240 is connected to a lower end of the memory string, as viewed in FIG. 2.

Each of a plurality of string select transistors 250-253 is connected between BL0 230 and the corresponding one of memory strings 210-213. That is, string select transistor 250 is connected between BL0 230 and the lower end of memory string 210; string select transistor 251 is connected between BL0 230 and the upper end of memory string 211; string select transistor 252 is connected between BL0 230 and the lower end of memory string 212; and string select transistor 253 is connected between BL0 230 and the upper end of memory string 213.

A plurality of ground select transistors 260 and 261 are connected at both ends of memory strings 210-213. That is, ground select transistor 260 is connected to an upper end of each memory string 210-213, as viewed in FIG. 2. Another ground select transistor 261 is connected to a lower end of each memory string 210-213, as viewed in FIG. 2.

A plurality of, e.g., sixty-four (64), word lines (WL0, WL1, . . . , WL63) 270 are arranged orthogonal to the plurality of memory strings 210-213. Each word line 270 is connected to the gate electrodes of a corresponding row of memory cells 220. Ground select transistors 260 of memory array 200 form a row and an even ground select line GSL(even) 280 is connected to the respective gate electrodes of the row of ground select transistors 260. Ground select transistors 261 form a row and an odd ground select line GSL(odd) 281 is connected to the respective gate electrodes of the row of ground select transistors 261. A plurality of string select lines (SSL0, SSL1, SSL2, SSL3) 290 are connected to corresponding ones of string select transistors 250.

In the embodiment illustrated in FIG. 2, memory array 200 includes four (4) memory strings 210-213 and sixty-four (64) WLs 270. However, the disclosed numbers of memory cells, memory strings, and word lines are not so limited. Memory array 200 can include any number of memory cells, memory strings, and word lines, arranged in an array.

Figure 3:
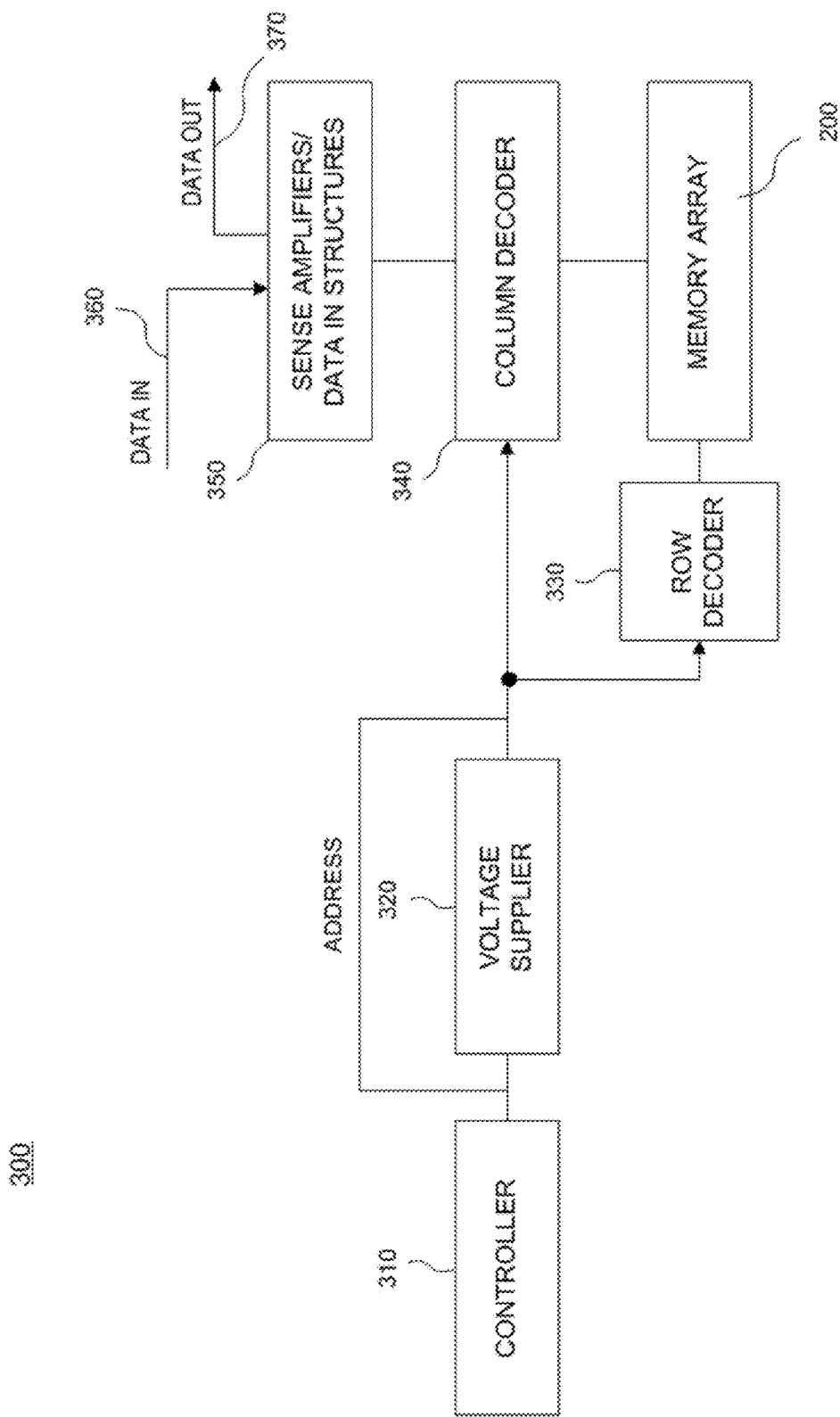
FIG. 3 schematically illustrates an integrated circuit including a memory array, according to an illustrated embodiment.

FIG. 3 schematically illustrates an integrated circuit 300 including memory array 200 illustrated in FIG. 2, according to an illustrated embodiment. Integrated circuit 300 includes a controller 310, a voltage supplier 320, a row decoder 330, a column decoder 340, and a sense amplifier 350. Controller 310 is configured to control the application of bias voltages or ground generated or provided by voltage supplier 320, to row decoder 330 and column decoder 340. Controller 310 is also configured to provide memory addresses to row decoder 330 and column decoder 340. Controller 310 can be implemented by using a special-purpose logic circuitry known in the art. Alternatively, controller 310 can be implemented by using a general-purpose processor, which executes a program stored in a storage device. Still alternatively, controller 310 can be implemented by using a combination of the special-purpose logic circuitry and the general-purpose processor. Row decoder 330 is coupled to WLs 270, connected to corresponding rows of memory cells 220 in memory array 200, in order to bias WLs 270 according to different biasing schemes for read operations, program operations, and erase operations, etc. Column decoder 340 is coupled to SSLs 290 connected to corresponding string select transistors 250 of columns in memory array 200 in order to bias SSLs 290 according to the different biasing schemes. Sense amplifier 350 senses input data received via a data-in line 360 from data sources (not shown) internal or external to integrated circuit 300 and supplies the input data to column decoder 340. Sense amplifier 350 also senses currents in corresponding ones of memory strings 210-213 in memory array 200, and converts the sensed currents into digital values to be supplied to devices (not shown) internal or external to integrated circuit 300 via a data-out line 370. More specifically, sense amplifier 350 includes a plurality of sub-sense amplifiers (not shown) each connected to a respective one of the memory strings, and senses the current in the respective memory string. Sense amplifier 350 then converts the sensed currents into the digital values, and combines the digital values with addresses of the corresponding one of memory strings 210-213, thus generating output data to be supplied on data-out line 370.

Once memory array 200 is manufactured, controller 310 is configured to perform an erase/reset operation on memory array 200, so that each one of memory cells 220 in memory array 200 has a threshold voltage $V_T$ at an EV level. An exemplary biasing scheme for performing the erase/reset operation is described as follows. During the erase/reset operation, BL0 230, CSLs 240, WLs 270, and SSLs 290 are grounded, and an erase voltage of about 18V is applied to the substrate (e.g., P-well) on which memory array 200 is formed. As a result, the threshold voltage $V_T$ of all of memory cells 220 in memory array 200 is set to the EV level.

After the resetting operation, controller 310 is configured to perform a program operation on selected ones of memory cells 220 of memory array 200, so that each one of the selected memory cells 220 has a threshold voltage $V_T$ at a PV level. An exemplary biasing scheme for performing the program operation is described as follows. For example, controller 310 is configured to program a cell A at the intersection of WL62 270 and memory string 212, as illustrated in FIG. 2. In order to program cell A, a system voltage $V_{CC}$ of about 3.3V is applied to SSL2 290 to turn on string select transistor 252 on memory string 212 to select memory string 212, and the other SSLs (SSL0, SSL1, SSL3) 290 are grounded to turn off string select transistors 250, 251, 253. In addition, a program voltage $V_{program}$ of about 18V is applied to WL62 270 to program cell A, and a pass voltage $V_{pass}$ of about 7V to 12V is applied to the unselected WLs (WL0, WL1, WL2, . . . , WL61, WL63) 270 to turn on other memory cells 220 on memory string 212. A voltage of 0V is applied to BL0 230, and system voltage Vcc is applied to an un-selected one of any other global bit lines (not shown in FIG. 2). CSLs 240, GSL (even) 280 and the substrate (e.g., P-well) on which memory array 200 is formed, are grounded. System voltage $V_{CC}$ is applied to GSL(odd) 281. As a result, an upper portion of memory string 212 between an upper source/drain electrode of cell A and CSL 240, and a bottom portion of memory string 212 between a lower source/drain electrode of cell A and BL0 230, are conductive. Therefore, electrons are injected into the charge storage layer of cell A, and $V_T$ of cell A is raised to the PV level. Hereinafter, a memory cell having a $V_T$ at the PV level is referred to as a "programmed cell", and a memory cell having a $V_T$ at the EV level is referred to as an "erased cell".

After the program operation, controller 310 is configured to perform a read operation on memory array 200. An exemplary biasing scheme for performing the read operation is described as follows. For example, in order to read cell A, first, all of SSLs 290 and GSLs 280 and 281 are turned off, a bit line voltage $V_{BL}$ of about 1V is applied to the global bit line (GBL), which is indicated as BL0 230 in FIG. 2. As a result, a GBL parasitic capacitance is pre-charged to a predetermined level of, for example, 1V. Next, system voltage $V_{CC}$ of about 3.3V is applied to GSLs 280 and 281 to turn on ground select transistors 260 and 261. System voltage $V_{CC}$ is also applied to SSL2 290 to turn on string select transistor 252 on memory string 212 to select memory string 212. The other SSLs (SSL0, SSL1, SSL3) 290 are grounded to turn off string select transistors 250, 251, 253. A read voltage $V_{read}$ of, for example, about 1V, which is between the EV level and the PV level, is applied to WL62 270 (hereinafter referred to as "selected WL".) A pass voltage $V_{pass}$ of about 6V, which is higher than the PV level, is applied to the unselected WLs (WL0, WL1, WL2, . . . , WL61, WL63) 270 to turn on other memory cells 220 on memory string 212 regardless of whether they are programmed cells or erased cells. Since cell A on selected WL62 is a programmed cell having $V_T$ at the PV level higher than $V_{read}$, cell A is turned off, while other cells on memory string 212 are turned on by the application of $V_{pass}$ higher than the PV level. Thus, memory string 212 is not conducting and the GBL parasitic capacitance is not discharged. As a result, a bit line voltage corresponding to a GBL operating bias remains unchanged. Otherwise, if cell A is an erased cell having $V_T$ at the EV level, cell A is turned on by the application of $V_{read}$ higher than EV, while other cells on memory string 212 are also turned on. In such case, memory string 212 is conducting and the GBL parasitic capacitance on memory string 212 is discharged. As a result, the bit line voltage corresponding the GLB operating bias will be changed.

The various voltages described above, including Vpass, Vread, Vprogram, VBL, Vcc, ground, are generated by voltage supplier 320, and are applied to memory array 200 by a circuitry not shown.

FIG. 4 schematically illustrates a programming pattern 400 used for programming memory cells 220 in memory array 200, according to an illustrated embodiment. Programming pattern 400 shows a distribution of programmed cells having $V_T$ at the PV level and erased cells having $V_T$ at the EV level. According to the illustrated embodiment of the disclosure, WL0 and WL63 are set as dummy word lines on which the memory cells are intentionally programmed to have $V_T$ at a PV' level. That is, according to FIG. 4, all of the memory cells 220 on edge WLs, i.e., word lines WL0 and WL63 that are located at opposite edges of memory array 200, are programmed cells, labeled "TV" in programming pattern 400 illustrated in FIG. 4. In addition, selected ones of the memory cells 220 on WL1 to WL62 are programmed according to the input data received via data-in line 360. Therefore, these programmed cells are labeled "PV". The remaining memory cells 220 are erased cells, labeled as "EV" in programming pattern 400 illustrated in FIG. 4. The PV' level of the memory cells on edge word lines WL0 and WL 63 may be equal to the PV level of the programmed memory cells on the word lines from WL1 to WL62. Alternatively, the PV' level may be different from the PV level.

As explained in more detail below, intentionally programming memory cells 220 on edge word lines WL0 and WL63 has the effect of suppressing a read disturbance. If memory cells 220 on edge word lines WL0 and WL63 are not programmed cells, the read disturbance may occur in some erased memory cells that are located close to the edge word lines and are adjacent to programmed cells.

Although programming pattern 400 illustrated in FIG. 4 includes programed cells on edge word lines WL0 and WL63, the present disclosure is not so limited. That is, the benefit of suppressing a read disturbance can also be realized by programming the memory cells on more than one edge word lines on each one of the opposite edges of the memory array. "Edge word line", as used herein, refer to the word lines at or adjacent to the edges of memory array. For example, the benefit of suppressing a read disturbance can be realized by programming the memory cells on WL0, WL1, WL62, and WL63, or on WL0-WL3, and WL61-WL63, etc.

Although programming pattern 400 illustrated in FIG. 4 includes a checkerboard pattern on the memory cells 220 between WL0 and WL63, i.e., a nearest neighbor of a programmed cell is an erased cell, and vice versa, the present disclosure is not so limited. The programming pattern on the memory cells 220 between WL0 and WL63 can be any pattern, depending on the input data, i.e., data to be stored in memory array 200.

Figure 5:
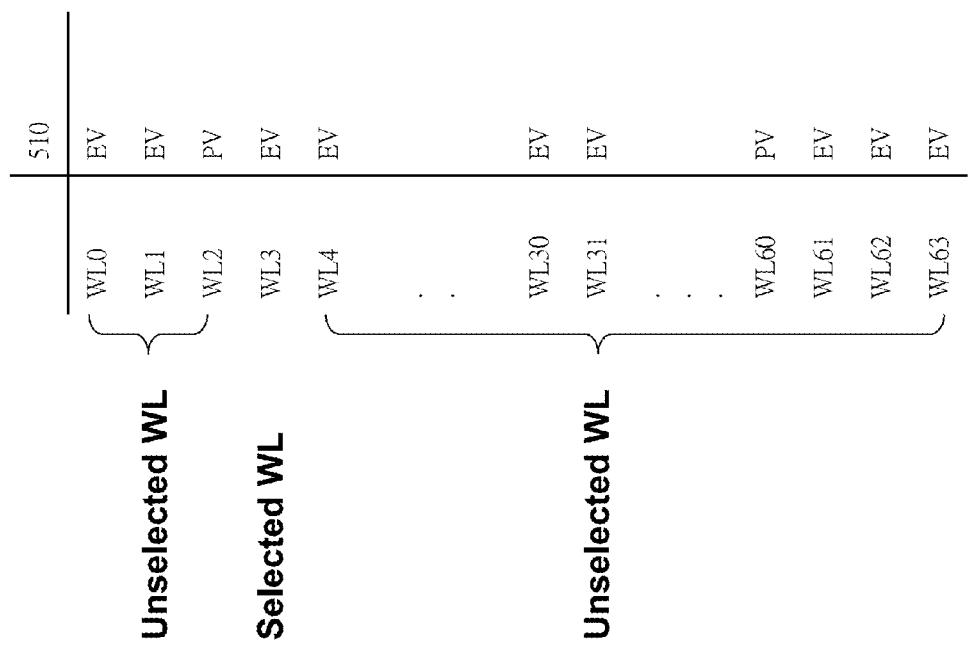
FIG. 5 is a programming pattern on a memory string, as a comparative example.

Below is an explanation regarding the reason for programming the memory cells 220 on edge WLs. FIG. 5 is a programming pattern on a memory string 510, as a comparative example. According to FIG. 5, the memory cells on WL2 and WL60 are programmed cells, while the memory cells on the other WLs, including the edge WLs (WL0 and WL63) are erased cells. In addition, WL3 is the selected WL to be read during the read operation, while WL0-WL2 and WL4-WL63 are unselected WLs.

Figure 6:
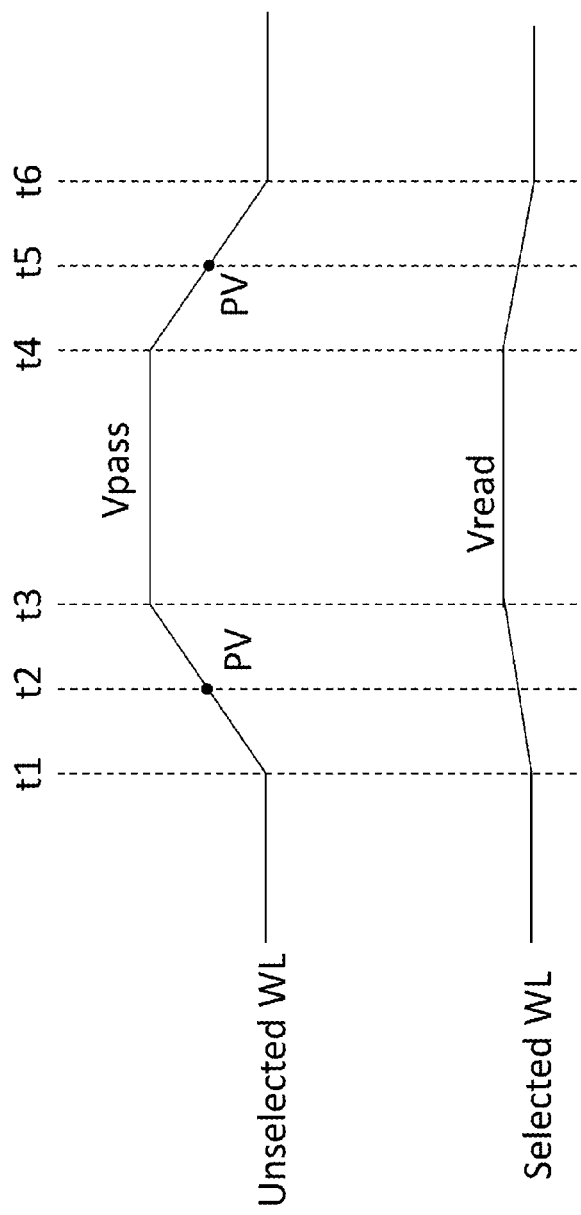
FIG. 6 schematically illustrates waveforms of a selected WL signal and an unselected WL signal during a read operation, according to an illustrated embodiment.

FIG. 6 schematically illustrates exemplary waveforms of a selected WL signal and an unselected WL signal to be applied to the selected WL and the unselected WLs, respectively, during the read operation, according to an illustrated embodiment. At time t1, the unselected WL signal is at an initial voltage level of, for example, 0V. Then, the unselected WL signal rises to the PV level of, for example, 3V, at time t2, and continues rising until it reaches $V_{pass}$ of, for example, 6V, at time t3. The unselected WL signal remains at $V_{pass}$ until time t4. Then, the unselected WL signal drops to the PV level at time t5, and continues dropping until it reaches 0V at time t6. The selected WL signal rises at the same time as the unselected WL signal at time t1, and reaches its target voltage level, $V_{read}$, at the same time that the unselected WL signal reaches $V_{pass}$ at time t3. In addition, the selected WL signal drops at the same time as the unselected WL signal at time t4, and reaches its target voltage level at the same time as the unselected WL signal at time t6.

Referring back to FIG. 5, when the unselected WL signal rises from 0V to 3V (i.e., the PV level) from t1 to t2, the programmed cells on WL2 and WL60 are turned off, and the erased cells on the unselected WLs (W0, WL1, WL4-WL59, and WL61-63) are turned on. Therefore, the channels of the memory cells between WL2 and WL60 are floating (i.e., not connected to a voltage source, such as ground or $V_{CC}$), and the channel potential is boosted by capacitive coupling with the gate voltage (the voltage of the unselected WL). On the other hand, because BL 230 and CSL 240 at both ends of memory string 510 are grounded, the channels of the memory cells between WL2 and BL, and between WL60 and CSL are grounded. As a result, in the memory cell on selected WL60, the voltage levels on opposite sides of the channel are not balanced, and hot carriers are generated. As a result, the $V_T$ of the memory cell on WL 61, which is adjacent to WL60 and located between WL 60 and CSL, is disturbed to a level higher than the EV level. Similarly, the $V_T$ of the memory cell on WL1, which is adjacent to WL2 and located between WL1 and BL, is also disturbed to a level higher than the EV level. As a result, the memory cells on WL1 and WL61 are disturbed by the read operation, i.e., read disturbed.

On the other hand, if the memory cells on WL0 and WL 63 are programmed cells, when the unselected WL rises from 0V to 3V (i.e., the PV level) from t1 to t2, the channels of the memory cells between WL0 and WL63 are floating. Therefore, the voltage levels on opposite sides of the channels of the programmed memory cells on WL2 and WL60 are balanced. As a result, the memory cells on WL1 and WL61 are not disturbed.

EXAMPLE

A memory array having the structure illustrated in FIG. 2 was fabricated. The memory array was reset and then programmed according to programming pattern 400 illustrated in FIG. 4. Next, a read stress was applied to the memory array by performing a read operation one million times. That is, the waveforms illustrated in FIG. 6 were repeated one million times. During the read operation, WL30 was used as the selected WL, and the other WLs were the unselected WLs. The threshold voltages $V_T$ of the memory cells on WL0-WL3 and WL60-WL63 were measured before and after the application of the read stress.

Figure 7B:
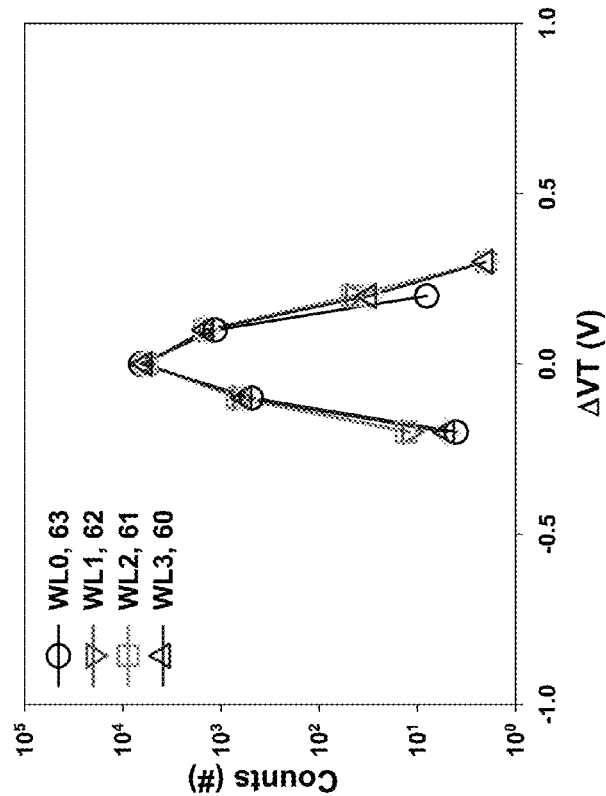
FIG. 7B is a graph showing a distribution of differences between the threshold voltages measured before and after the application of the read stress on the memory array that has been programmed according to the programming pattern of FIG. 4.
Figure 7A:
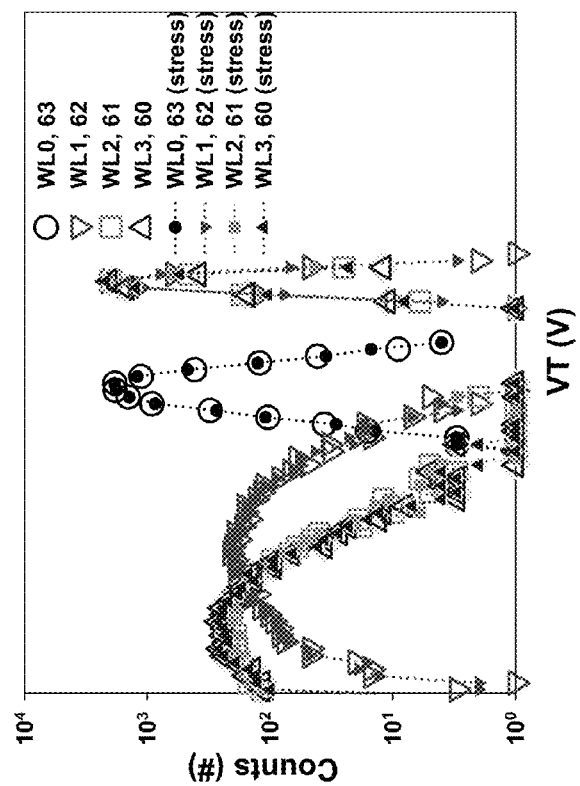
FIG. 7A is a graph showing a distribution of threshold voltages measured before and after application of read stress on a memory array that has been programmed according to the programming pattern of FIG. 4.

FIG. 7A is a graph showing a distribution of the threshold voltages $V_T$ of the memory cells on WL0-WL3 and WL60-WL63 measured before and after the application of the read stress. In the graph of FIG. 7A, the x-axis indicates values of the threshold voltages, and the y-axis indicates the count (i.e., number) of memory cells on each one of WL0-WL3 and WL60-WL63 that have a specific threshold voltage. The dotted lines in FIG. 7A refer to the threshold voltages measured on respective memory cells before the read operations, and the solid lines in FIG. 7A refer to the threshold voltages measured on respective memory cells after the read operations. FIG. 7B is a graph showing a distribution of the differences between the threshold voltages measured on respective memory cells before and after the application of the read stress. In the graph of FIG. 7B, the x-axis indicates values of the threshold voltage differences, and the y-axis indicates the count (i.e., number) of memory cells on each one of WL0-WL3 and WL60-WL63 that have a specific threshold voltage difference. The solid lines in FIG. 7B refer to the threshold voltage differences measured on respective memory cells. According to FIG. 7B, the differences of the threshold voltages of the memory cells on WL0-WL3 and WL60-WL63 ranges from −0.2 V to 0.2 V, even after performing the read operation one million times, indicating that the memory cells on WL0-WL3 and WL60-WL63 are substantially immune to read disturb.

COMPARATIVE EXAMPLE

A memory array having the structure illustrated in FIG. 2 was fabricated. The memory array was reset and then programmed according to a programming pattern 800 illustrated in FIG. 8. Programming pattern 800 is similar to programming pattern 400 except that the memory cells on WL0 and WL63 are erased cells, and thus their $V_T$ remains at the EV level. Next, a read stress was applied to the memory array, in the same manner as in the Example. The threshold voltages $V_T$ of the memory cells on WL0-WL3 and WL60-WL63 were measured before and after the application of the read stress.

Figure 9B:
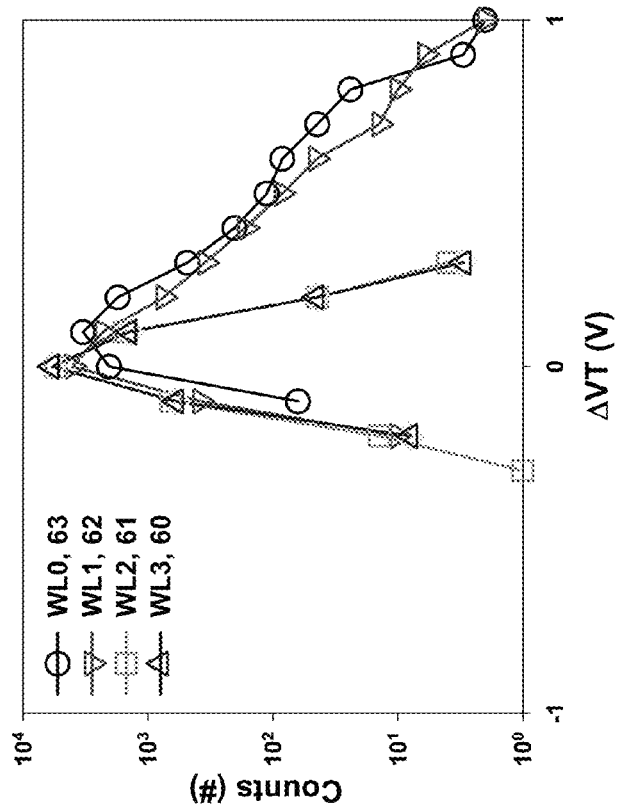
FIG. 9B is a graph showing a distribution of differences between the threshold voltages measured before and after the application of the read stress on the memory array that has been programmed according to the programming pattern of FIG. 8.
Figure 9A:
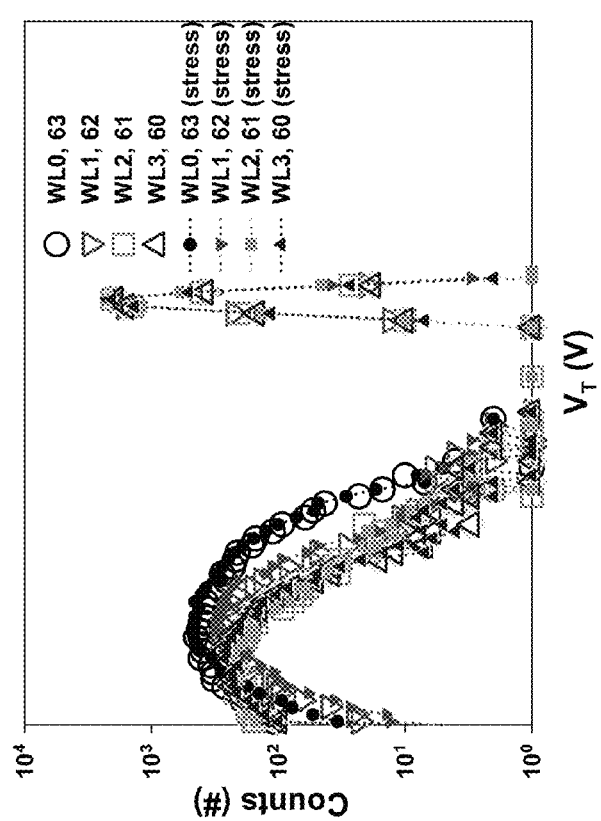
FIG. 9A is a graph showing a distribution of threshold voltages measured before and after application of read stress on a memory array that has been programmed according to the programming pattern of FIG. 8.

FIG. 9A is a graph showing a distribution of the threshold voltages measured before and after the application of the read stress. In the graph of FIG. 9A, the x-axis indicates values of the threshold voltages, and the y-axis indicates the count (i.e., number) of memory cells on each one of WL0-WL3 and WL60-WL63 that have a specific threshold voltage. The dotted lines in FIG. 9A refer to the threshold voltages measured on respective memory cells before the read operations, and the solid lines in FIG. 9A refer to the threshold voltages measured on respective memory cells after the read operations. FIG. 9B is a graph showing a distribution of the differences between the threshold voltages measured before and after the read operations. In the graph of FIG. 9B, the x-axis indicates values of the threshold voltage differences, and the y-axis indicates the count (i.e., number) of memory cells on each one of WL0-WL3 and WL60-WL63 that have a specific threshold voltage difference. The solid lines in FIG. 9B refer to the threshold voltage differences measured on respective memory cells. According to FIG. 9B, the differences of the threshold voltages of the memory cells on WL2, WL3, WL 60, and WL61 ranges from −0.2 V to 0.2 V, while the differences of the threshold voltages of the memory cells on WL0, WL1, WL62, and WL 63 ranges from −0.2 V to 1 V. Thus, the memory cells on WL0, WL1, WL62, and WL 63 are read disturbed by the application of the read stress.

In the embodiment illustrated above, programming pattern 400 illustrated in FIG. 4 includes only one PV level. However, the present disclosure is not so limited. When memory cells 220 in memory array 200 are MLCs having multiple PV levels, the memory cells, including the memory cells on the edge WLs (WL0 and WL63) can be programmed to have a $V_T$ at various PV levels. In an embodiment, the $V_T$ of each programmed memory cell on the edge WLs (e.g., WL0 and WL63) is set at a PV' level which is higher than the lowest PV level $PV_{lowest}$ of the programmed cells located between the edge WLs (e.g., WL1 to WL 62), but is lower than $V_{pass}$. That is, $PV_{lowest} < PV' < V_{pass}$. Thus, when the unselected WL signal rises from 0V to $V_{pass}$, the programmed memory cells on the edge WLs will be turned on later than the programmed memory cells located between the edge WLs and having the lowest PV level $PV_{lowest}$. As a result, the channels of the memory cells between the edge WLs are floating, thus suppressing the read disturb.

In the embodiment illustrated in FIG. 2, string select transistors 250-253 and ground select transistors 260 and 261 are formed in a traditional metal-oxide-semiconductor (MOS) structure having a gate dielectric layer formed of silicon oxide. Alternatively, string select transistors 250-253 and ground select transistors 260 and 261 can be multi-layer memory cells having a structure illustrated in FIG. 1. In such case, the memory cells on SSL 290 and GSL 280 are programmed to have a $V_T$ at a PV level that is lower than Vcc to be applied to SSL 290 and GSL 280, such that they can be turned on by the application of Vcc.

In memory array 200 illustrated in FIG. 2, each one of memory cells 220 is a charge storage transistor having a charge storage layer. Alternatively, each one of memory cells 220 can be a floating gate transistor having a floating gate layer. Still alternatively, memory array 200 can include a first plurality of charge storage transistors and a second plurality of floating gate transistors.

In addition, the disclosure is not limited to the specific biasing schemes for the erase/reset operation, the program operation, and the read operation as described in the above embodiments. That is, various biasing conditions can be implemented for the erase/reset operation, the program operation, and the read operation.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of operating a memory array including a plurality of memory cells arranged in rows and columns, wherein a plurality of parallel memory strings correspond to respective ones of the columns, and a plurality of word lines are arranged orthogonal to the plurality of memory strings, each word line being connected to gate electrodes of a corresponding one of the rows of memory cells,
the method comprising:
    performing a program operation that programs all of the memory cells on edge word lines located at opposite edges of the memory array, and that programs selected memory cells between the edge word lines in the memory array according to input data to be stored in the memory array, each programmed memory cell having a threshold voltage at a program verify (PV) level; and
    performing a read operation after performing the program operation, the read operation including pre-charging a global bit line parasitic capacitance to a predetermined level.

2. The method of claim 1, further comprising performing a reset operation before performing the program operation, the reset operation resetting all of the memory cells in the memory array, so that each memory cell has a threshold voltage at an erase verify (EV) level lower than the PV level.

3. The method of claim 1, wherein the memory cells are multi-level cells having multiple PV levels, and the performing the program operation includes:
    programming the selected memory cells between the edge word lines to have threshold voltages at various PV levels including a lowest PV level; and
    programming all of the memory cells on the edge word lines to have a threshold voltage higher than the lowest PV level of the programmed memory cells between the edge word lines.

4. The method of claim 1, wherein the read operation further includes, after the pre-charging the global bit line parasitic capacitance to the predetermined level:
    applying a read voltage to a selected word line; and
    applying a pass voltage to the remaining unselected word lines, the pass voltage being higher than the read voltage.

5. The method of claim 4, wherein,
the applying the read voltage to the selected word line includes raising a word line voltage from an initial voltage level to a read voltage level, and
the applying the pass voltage to the unselected word lines includes raising a word line voltage from the initial voltage level to a pass voltage level higher than the read voltage level.

6. An integrated circuit, comprising:
a memory array including memory cells arranged in rows and columns, wherein a plurality of parallel memory strings correspond to respective ones of the columns, and a plurality of word lines are arranged orthogonal to the plurality of memory strings, each word line being connected to gate electrodes of a corresponding one of the rows of memory cells; and
a control circuit configured to:
    perform a program operation on the memory array to program all of the memory cells on edge word lines located at opposite edges of the memory array, and program selected memory cells between the edge word lines in the memory array according to input data to be stored in the memory array, each programmed memory cell having a threshold voltage at a program verify (PV) level; and
    perform a read operation after performing the program operation by pre-charging a global bit line parasitic capacitance to a predetermined level.

7. The integrated circuit of claim 6, wherein the control circuit is also configured to perform a reset operation before performing the program operation, the reset operation resetting all of the memory cells in the memory array, so that each memory cell has a threshold voltage at an erase verify (EV) level lower than the PV level.

8. The integrated circuit of claim 6, wherein the memory cells are single level cells.

9. The integrated circuit of claim 6, wherein the memory cells are multi-level cells.

10. The integrated circuit of claim 9, wherein the control circuit is configured to perform the program operation to program all of the multi-level cells on the edge word lines to have a threshold voltage higher than the threshold voltage of each programmed memory cells between the edge word lines.

11. The integrated circuit of claim 6, wherein the memory cells are floating gate transistors.

12. The integrated circuit of claim 6, wherein, to perform the read operation, the control circuit is further configured to, after the global bit line parasitic capacitance is pre-charged to the predetermined level:
    apply a read voltage to a selected word line; and
    apply a pass voltage of the remaining unselected word lines, the pass voltage being higher than the read voltage.

13. The integrated circuit of claim 12, wherein,
to apply the read voltage to the selected word line, the control circuit is further configured to raise a word line voltage from an initial voltage level to a read voltage level, and
to apply the pass voltage to the unselected word lines, the control circuit is further configured to raise a word line voltage from the initial voltage level to a pass voltage level higher than the read voltage level.

14. The integrated circuit claim 12, wherein the memory array includes more than one edge word line located at at least one edge of the memory array.

15. A control circuit for operating a memory array including a plurality of memory cells, the control circuit comprising:
circuitry configured to:
perform a program operation on the memory array to program all of the memory cells on edge word lines located at opposite edges of the memory array, and program selected memory cells between the edge word lines in the memory array according to input data to be stored in the memory array, each programmed memory cell having a threshold voltage at a program verify (PV) level; and
perform a read operation after performing the program operation by pre-charging a global bit line parasitic capacitance to a predetermined level.

16. The control circuit of claim 15, wherein the memory cells are multi-level cells having multiple PV levels, and the performing the program operation includes:
programming the selected memory cells between the edge word lines to have threshold voltages at various PV levels including a lowest PV level; and
programming all of the memory cells on the edge word lines to have a threshold voltage higher than the lowest PV level of the programmed memory cells between the edge word lines.

* * * * *